United States Patent
Kawano

(10) Patent No.: US 8,334,167 B2
(45) Date of Patent: Dec. 18, 2012

(54) METHOD OF MANUFACTURING PHOTOELECTRIC CONVERSION DEVICE

(75) Inventor: Akihiro Kawano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/228,186

(22) Filed: Sep. 8, 2011

(65) Prior Publication Data

US 2011/0318873 A1    Dec. 29, 2011

Related U.S. Application Data

(63) Continuation of application No. 12/754,201, filed on Apr. 5, 2010, now Pat. No. 8,039,293.

(30) Foreign Application Priority Data

May 12, 2009    (JP) .................. 2009-115921

(51) Int. Cl.
  *H01L 21/00* (2006.01)
(52) U.S. Cl. .................... 438/98; 438/431
(58) Field of Classification Search ............ 439/73, 439/98, 626, 631, 645; 438/73, 98, 626, 438/631, 645
  See application file for complete search history.

(56) References Cited

U.S. PATENT DOCUMENTS

| | | | |
|---|---|---|---|
| 5,960,310 A | 9/1999 | Jeong | |
| 6,214,745 B1 | 4/2001 | Yang et al. | |
| 6,441,456 B1 | 8/2002 | Konishi et al. | |
| 7,459,335 B2 | 12/2008 | Uchida et al. | |
| 7,470,981 B2 | 12/2008 | Egusa | |
| 2004/0087140 A1 | 5/2004 | Kordic et al. | |
| 2007/0102738 A1* | 5/2007 | Adkisson et al. | 257/292 |
| 2008/0036026 A1 | 2/2008 | Park | |
| 2009/0166783 A1 | 7/2009 | Maruyama et al. | |

FOREIGN PATENT DOCUMENTS

| | | |
|---|---|---|
| JP | 2000-150806 A | 5/2000 |
| JP | 2000-223492 A | 8/2000 |
| JP | 2004-071790 A | 3/2004 |
| JP | 2006-100571 A | 4/2006 |
| JP | 2007-258328 A | 10/2007 |

* cited by examiner

Primary Examiner — Fernando L Toledo
Assistant Examiner — Bryan Junge
(74) Attorney, Agent, or Firm — Fitzpatrick, Cella, Harper & Scinto

(57) ABSTRACT

A method of manufacturing a photoelectric conversion device having a semiconductor substrate, comprises a first step of forming an insulating film on the semiconductor substrate, a second step of forming first holes in the insulating film, a third step of forming, in the insulating film, second holes shallower than the first holes, a fourth step of forming electrically conductive portions by embedding an electrically conductive material in the first holes, and forming planarization assisting portions by embedding the electrically conductive material in the second holes, and a fifth step of polishing the electrically conductive portions, the insulating film, and the planarization assisting portions until the planarization assisting portions are removed, thereby planarizing upper surfaces of the electrically conductive portions and the insulating film.

12 Claims, 6 Drawing Sheets

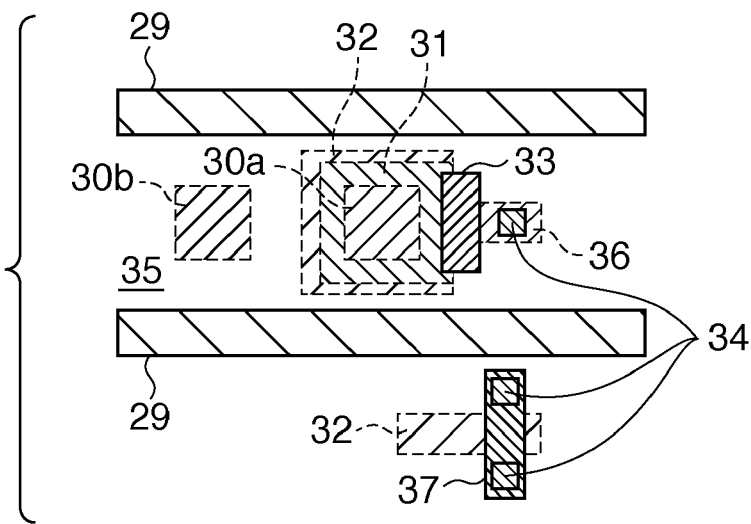
F I G. 5A
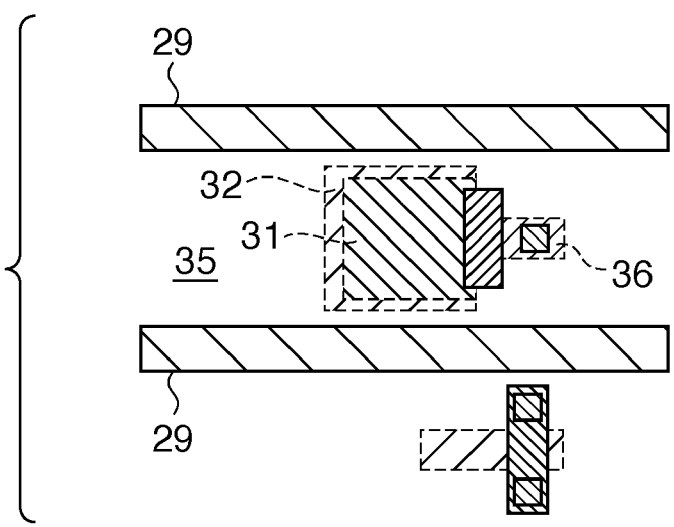
F I G. 5B

METHOD OF MANUFACTURING PHOTOELECTRIC CONVERSION DEVICE

CROSS-REFERENCE TO RELATED APPLICATIONS

This application is a continuation of application Ser. No. 12/754,201, filed Apr. 5, 2010, which claims the benefit of Japanese Patent Application No. 2009-115921, filed May 12, 2009. Both prior applications are hereby incorporated by reference herein in their entirety.

BACKGROUND OF THE INVENTION

1. Field of the Invention

The present invention relates to a method of manufacturing a photoelectric conversion device.

2. Description of the Related Art

For conventional semiconductor devices, CMP (Chemical Mechanical Polishing) is widely used in a step of forming conductive lines with a damascene structure. In the CMP, polishing is generally done using an abrasive called slurry. The polishing rate of a metal conductive line is higher than that of an insulating film. The difference in the polishing rate sometimes degrades the planarity of the polished surfaces (the upper surfaces of the metal conductive line and insulating film). More specifically, in the polishing step using CMP, polishing progresses faster in a region where the pattern density of metal conductive lines is locally high than in a region where the pattern density of metal conductive lines is low. This may cause planarity degradation called erosion. A measure for preventing this is widely used, in which polishing by CMP is performed after forming, in the low pattern density region, dummy conductive lines that are not used for electrical connections.

However, if the dummy conductive lines remain even after the polishing, conductive lines need to be laid out while being kept off the dummy conductive lines, which do not aim at electrical connections. This may limit the degree of freedom of conductive line layout. In addition, the capacitance between the conductive lines may increase due to the existence of the dummy conductive lines, resulting in delay in the conductive lines. In a solid-state image capturing element, dummy conductive lines remaining above the photoelectric converter shield light that should strike the photoelectric converter, and lower the sensitivity of the photoelectric converter. Japanese Patent Laid-Open No. 2004-071790 proposes removing dummy conductive lines after polishing of CMP. More specifically, a concave portion 128 is formed by etching an uppermost interlayer insulating film 127 of an image capturing element portion 129 so as to expose a dummy conductive line 126A. Then, the dummy conductive line 126A is removed by etching. Japanese Patent Laid-Open No. 2004-071790 also describes that the bottom surface of the concave portion may further be planarized by etching, a filler may be injected into the concave portion to make that portion flush with a peripheral circuit portion 130, and planarization may then be done all over the structure. In this manufacturing method, the process of improving the planarity of the upper surface of the uppermost interlayer insulating film 127 is complex as a whole.

SUMMARY OF THE INVENTION

The present invention provides a new planarization technique for a method of manufacturing a photoelectric conversion device.

One of the aspects of the present invention provides a method of manufacturing a photoelectric conversion device having a semiconductor substrate, the method comprising a first step of forming an insulating film on the semiconductor substrate, a second step of forming first holes in the insulating film, a third step of forming, in the insulating film, second holes shallower than the first holes, a fourth step of forming electrically conductive portions by embedding an electrically conductive material in the first holes, and forming planarization assisting portions by embedding the electrically conductive material in the second holes, and a fifth step of polishing the electrically conductive portions, the insulating film, and the planarization assisting portions until the planarization assisting portions are removed, thereby planarizing upper surfaces of the electrically conductive portions and the insulating film.

Further features of the present invention will become apparent from the following description of exemplary embodiments with reference to the attached drawings.

BRIEF DESCRIPTION OF THE DRAWINGS

FIGS. 5A and 5B are plan views showing a method of manufacturing a photoelectric conversion device according to the fourth embodiment.

DESCRIPTION OF THE EMBODIMENTS

In this specification, forming a second layer "on" a first layer includes not only forming the second layer immediately on the first layer but also forming a third layer on the first layer and then forming the second layer on the third layer. In addition, forming a second layer "under" a first layer includes not only forming the second layer immediately under the first layer but also forming a third layer under the first layer and then forming the second layer under the third layer.

Figure 1A:
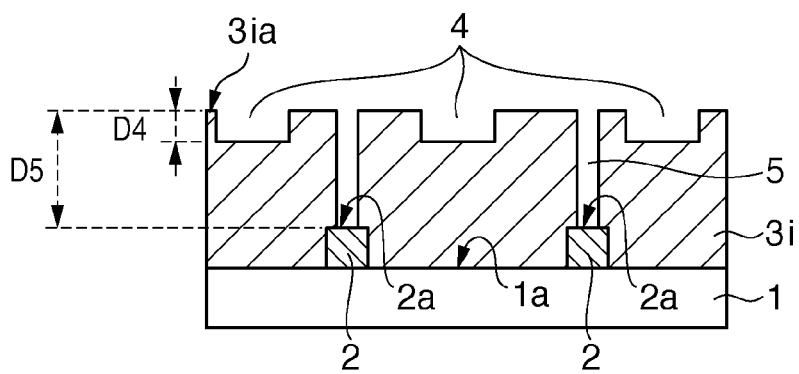
FIGS. 1A to 1C are sectional views showing steps in a method of manufacturing a photoelectric conversion device according to the first embodiment.

A method of manufacturing a semiconductor device 20 according to the first embodiment of the present invention will be described with reference to FIGS. 1A to 1C. The semiconductor device 20 can include a photoelectric conversion device 100 (FIG. 2). The photoelectric conversion device 100 can include, for example, a line sensor such as a CMOS image sensor or a photometric sensor/auto focus sensor. In the step of FIG. 1A, a semiconductor region is formed on a semiconductor substrate 1. The semiconductor region can include semiconductor regions which prospectively serve as the source and drain regions of a transistor. The semiconductor region can also include a photoelectric converter which has a charge accumulation region for accumulating charges corresponding to light and a protective region for preventing the charge accumulation region from exposing to the surface. The photoelectric converter can be a photodiode. The semiconductor region can also include a charge-voltage converter for converting charges generated in and transferred from the photoelectric converter into a voltage. The charge-voltage converter can be, for example, a floating diffusion. Next, lower-layer conductive lines 2 are formed on the semiconductor substrate 1. Then, an interlayer insulating film 3$i$ is deposited (formed) to cover the semiconductor substrate 1 and the lower-layer conductive lines 2 (first step). The interlayer insulating film 3$i$ can be formed from, for example, BPSG or P-SiO (a silicon oxide film formed by plasma CVD). A first resist pattern is formed on the interlayer insulating film 3$i$. The first resist pattern has openings corresponding to regions where second holes 4 should be formed. Using the first resist pattern as a mask, etching (for example, dry etching) is performed from a surface 3$ia$ of the interlayer insulating film 3$i$ up to a depth D4, thereby forming the second holes 4 in the interlayer insulating film 3$i$ (third step). The second holes 4 are used to arrange planarization assisting portions 72 (to be described later) which are not used for electrical connections. The second holes 4 are formed to be shallower than first holes 5 (to be described later) (D4<D5). The second holes 4 are so deep not to reach, for example, the lower-layer conductive lines 2 or the semiconductor substrate 1 but to allow to easily remove, by CMP (Chemical Mechanical Polishing), the planarization assisting portions 72 embedded in the second holes 4. After that, the first resist pattern is peeled off (removed). A second resist pattern is formed on the interlayer insulating film 3$i$. The second resist pattern has openings corresponding to regions where the first holes 5 should be formed. Using the second resist pattern as a mask, etching (for example, dry etching) is performed from the surface 3$ia$ of the interlayer insulating film 3$i$ up to the depth D5, thereby forming the first holes 5 in the interlayer insulating film 3$i$ (second step). The first holes 5 are used to arrange electrically conductive portions 71$i$ (to be described later) to be used for electrical connections. The first holes 5 are formed to be deeper than the second holes 4 (D5>D4). The first holes 5 are so deep as to reach, for example, the lower-layer conductive lines 2 or the semiconductor substrate 1. The first holes 5 can include via holes which expose part of upper surfaces 2$a$ of the lower-layer conductive lines 2. The first holes 5 can include via holes which expose part (of a surface 1$a$) of the upper surface of the semiconductor region or part of the upper surface of the charge-voltage converter. Instead of performing the second step next to the third step, the third step may be executed next to the second step. In the second and third steps, the plurality of first holes 5 and the plurality of second holes 4 can be formed in the interlayer insulating film 3$i$ such that the plurality of holes including the plurality of first holes 5 and the plurality of second holes 4 are arranged at uniform pitches (equal densities).

Figure 1B:
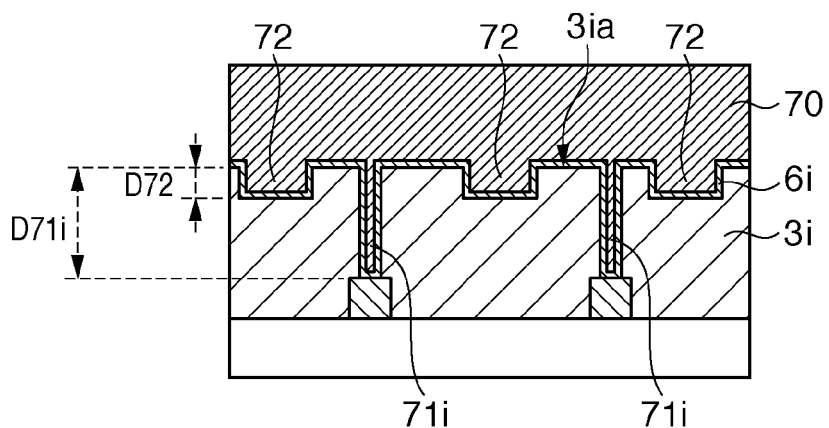
Figure 2:
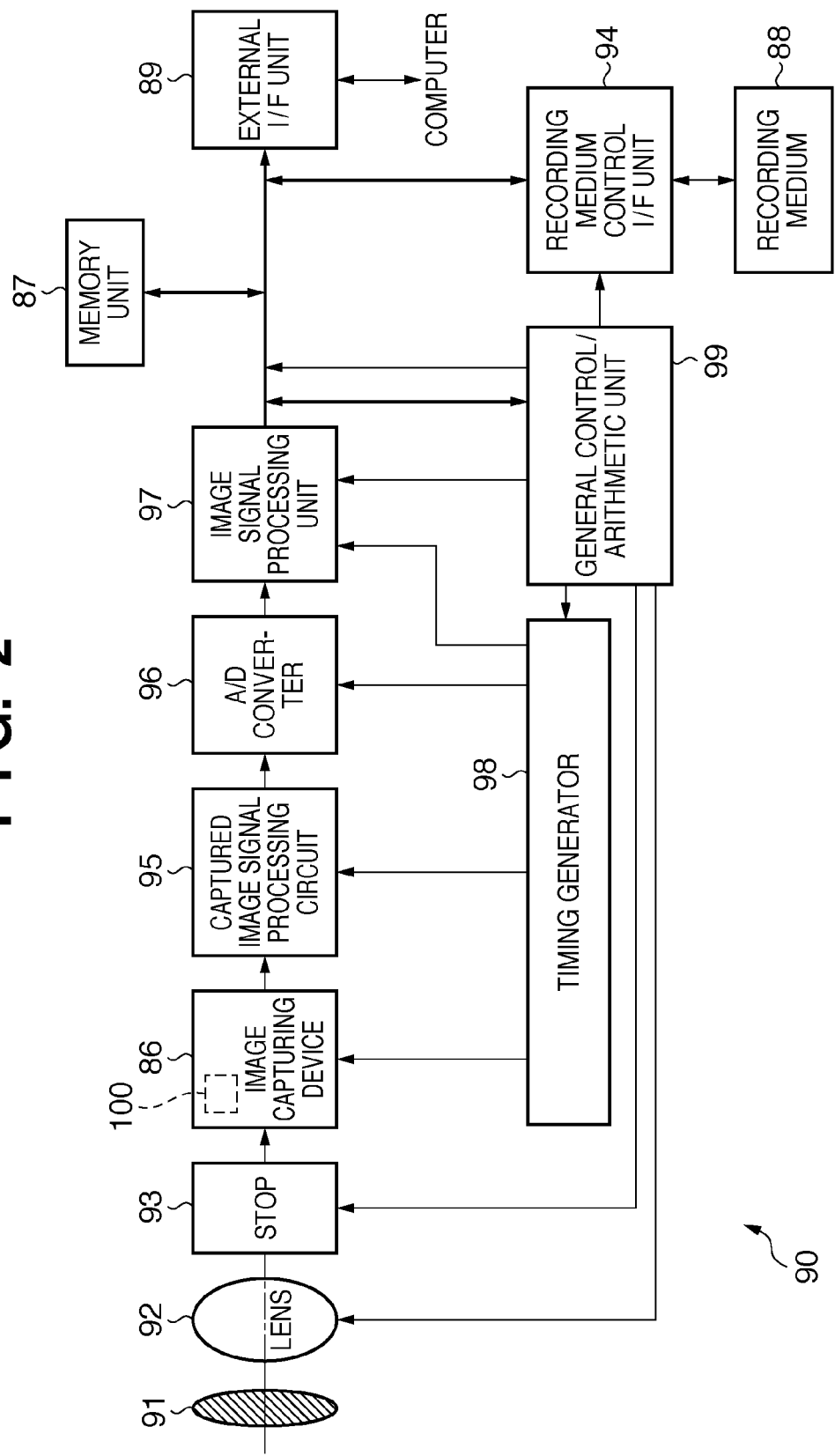
FIG. 2 is a block diagram showing the arrangement of an image capturing system using the photoelectric conversion device according to the first embodiment.

In the step of FIG. 1B, a barrier metal 6$i$ is deposited (formed) to cover the upper surface of the insulating film 3$i$, the side and bottom surfaces of the first holes 5, and the side and bottom surfaces of the second holes 4. The barrier metal 6$i$ can include, for example, a TiN single-layer structure or a Ti/TiN two-layer structure. Next, an electrically conductive material 70 is deposited to further cover the upper surface of the insulating film 3$i$, the side and bottom surfaces of the first holes 5, and the side and bottom surfaces of the second holes 4. The electrically conductive material 70 can be formed from a metal or an intermetallic compound containing at least one of, for example, Cu, W, Al, TiN, Ti, Ta, and TaN as a major component. That is, the electrically conductive material 70 is embedded in the first holes 5 to form the electrically conductive portions 71$i$, and simultaneously, the electrically conductive material 70 is embedded in the second holes 4 to form the planarization assisting portions 72 (fourth step). This facilitates simultaneously forming the electrically conductive portions 71$i$ and the planarization assisting portions 72. Hence, the steps can be simplified as compared to a case in which the process of forming the electrically conductive portions 71$i$ and the process of forming the planarization assisting portions 72 are performed in different steps.

Figure 1C:
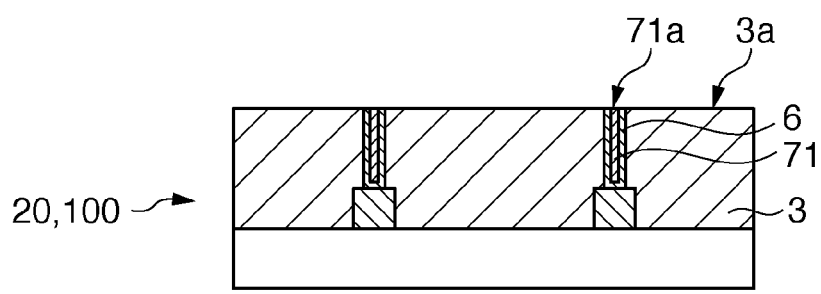

In the step of FIG. 1C, the electrically conductive material 70 undergoes CMP (Chemical Mechanical Polishing) using an abrasive (slurry) until the upper surface 3$ia$ of the interlayer insulating film 3$i$ is exposed. The electrically conductive portions 71$i$, interlayer insulating film 3$i$, and planarization assisting portions 72 are further polished using the abrasive (slurry) until the planarization assisting portions 72 are removed. The electrically conductive portions 71$i$ and the interlayer insulating film 3$i$ thus change to electrically conductive portions 71 and an interlayer insulating film 3 having planarized upper surfaces 71$a$ and 3$a$ (fifth step). That is, the planarization process in the fifth step includes removing the unnecessary portions of the electrically conductive material 70. "Until the planarization assisting portions 72 are removed" means that the CMP is performed up to a depth ranging from D72 to (D72+Dth) (both inclusive) from the upper surface 3$ia$ of the interlayer insulating film 3$i$. Dth is a polishing thickness serving as a threshold not to degrade planarity when the upper surfaces of the electrically conductive portions 71 and the interlayer insulating film 3 are planarized without forming the planarization assisting portions 72. In other words, Dth is a polishing thickness which makes the tilt angle of the polished surface with respect to the surface of the semiconductor substrate fall within the tolerance when the upper surfaces of the electrically conductive portions 71 and the interlayer insulating film 3 are planarized without forming the planarization assisting portions 72. When polishing is done until the planarization assisting portions 72 are removed, the barrier metal 6$i$ is removed except on the side and bottom surfaces of the electrically conductive portions 71 so that a barrier metal 6 that covers the side and bottom surfaces of the electrically conductive portions 71 remains. The electrically conductive portions 71 can include via plugs to connect conductive lines arranged on them to the lower-layer conductive lines 2. Alternatively, the electrically conductive portions 71 can include via plugs to connect conductive lines arranged on them to the above-described semiconductor regions or charge-voltage converter.

Assume that the planarization assisting portions 72 are not formed. In this case, the polishing rate of the electrically conductive portions 71$i$ is higher than that of the interlayer insulating film 3$i$. For this reason, polishing progresses faster in a region where the pattern density of the electrically conductive portions 71$i$ is locally high than in a region where the pattern density of the electrically conductive portions 71$i$ is low. This may cause planarity degradation called erosion on the upper surfaces of the electrically conductive portions 71$i$ and the interlayer insulating film 3$i$. In this embodiment, however, since the planarization assisting portions 72 are formed in addition to the electrically conductive portions 71$i$, stress received from the polishing apparatus upon polishing disperses to the electrically conductive portions 71$i$ and the planarization assisting portions 72 (arranged in the region where the pattern density of the electrically conductive portions 71 is low). This reduces the nonuniformity of polished amount between the region where the pattern density of the electrically conductive portions 71 is locally high and the region where the pattern density of the electrically conductive portions 71 is low. Hence, the planarity degradation called erosion on the upper surfaces of the electrically conductive portions 71$i$ and the interlayer insulating film 3$i$ also decreases. Especially, in this embodiment, the plurality of holes including the plurality of first holes 5 and the plurality of second holes 4 are arranged at uniform pitches (equal densities), and accordingly, the plurality of members including the plurality of electrically conductive portions 71i and the plurality of planarization assisting portions 72 are arranged at uniform pitches (equal densities). Since this structure can uniform the stress applied to the plurality of electrically conductive portions 71i and the plurality of planarization assisting portions 72 upon polishing in the planar direction along the surface 1a of the semiconductor substrate 1, variations in the polished amount in the planar direction can be reduced. It is consequently possible to effectively suppress erosion.

Assume that polishing is completed without removing the planarization assisting portions 72, and the planarization assisting portions 72 are kept remaining even after that. In this case, it is necessary to lay out conductive lines while keeping them off the planarization assisting portions. This limits the degree of freedom of conductive line layout. In addition, the parasitic capacitance increases due to the existence of the planarization assisting portions, and delay in the conductive lines occurs. This may slow down the circuit operation. If the semiconductor device is a photoelectric conversion device, the planarization assisting portions remaining above the photoelectric converter may shield light to the photoelectric converter, and lower the sensitivity of the photoelectric converter. According to this embodiment, however, since the planarization assisting portions are finally removed by CMP, the electrical and optical adverse effects of the planarization assisting portions on the semiconductor device can be reduced. Assume that polishing is completed without removing the planarization assisting portions 72, but the planarization assisting portions 72 are removed later. In this case, concave portions, which expose the planarization assisting portions 72 are formed by etching the interlayer insulating film 3 on the planarization assisting portions 72. The planarization assisting portions 72 are then removed by etching. The bottom surfaces of the concave portions are planarized by etching. A filler is injected into the concave portions to make them flush with the peripheral portions. After that, planarization is executed on the entire surface. In this manufacturing method, the process of improving the planarity of the upper surface of the interlayer insulating film 3 is complex as a whole. In this embodiment, however, the electrically conductive portions 71, interlayer insulating film 3, and planarization assisting portions 72 are polished until the planarization assisting portions 72 are removed, thereby planarizing the upper surfaces 71a and 3a of the electrically conductive portions 71 and the interlayer insulating film 3. More specifically, since the second holes 4 are shallower than the first holes 5 (D4<D5), the depth of the planarization assisting portions 72 from the upper surface 3ia of the interlayer insulating film 3i is smaller than the depth of the electrically conductive portions 71i (D72<D71i). For these reasons, the electrically conductive portions 71i can easily obtain flat upper surfaces when the process of performing polishing until the planarization assisting portions 72 are removed has ended. As a result, the process of improving the planarity of the upper surface of the interlayer insulating film 3 is simpler as a whole than in the case in which polishing is completed without removing the planarization assisting portions 72, and the planarization assisting portions 72 are removed later. As described above, according to this embodiment, it is possible to provide a new planarization process for a semiconductor device manufacturing method. Note that the electrically conductive portion may include a conductive line in place of a via plug, or may include a conductive line in addition to a via plug. That is, the electrically conductive portion may include at least one of a via plug and a conductive line.

FIG. 2 illustrates an example of an image capturing system using the above-described photoelectric conversion device 100. As shown in FIG. 2, an image capturing system 90 mainly includes an optical system, an image capturing device 86, and a signal processing unit. The optical system mainly includes a shutter 91, a lens 92, and a stop 93. The image capturing device 86 includes the photoelectric conversion device 100. The signal processing unit mainly includes a captured image signal processing circuit 95, an A/D converter 96, an image signal processing unit 97, a memory unit 87, an external I/F unit 89, a timing generator 98, a general control/arithmetic unit 99, a recording medium 88, and a recording medium control I/F unit 94. Note that the signal processing unit need not always include the recording medium 88. The shutter 91 is provided on the optical path in front of the lens 92 to control exposure. The lens 92 refracts incident light and forms an object image on the imaging plane of the photoelectric conversion device 100 in the image capturing device 86. The stop 93 is provided on the optical path between the lens 92 and the photoelectric conversion device 100 to adjust the amount of light that has passed through the lens 92 and is guided to the photoelectric conversion device 100. The photoelectric conversion device 100 in the image capturing device 86 converts the object image formed on the imaging plane of the photoelectric conversion device 100 into an image signal. The image capturing device 86 outputs the image signal read out from the photoelectric conversion device 100. The captured image signal processing circuit 95 is connected to the image capturing device 86 to process the image signal output from the image capturing device 86. The A/D converter 96 is connected to the captured image signal processing circuit 95 to convert the processed image signal (analog signal) output from the captured image signal processing circuit 95 into an image signal (digital signal). The image signal processing unit 97 is connected to the A/D converter 96 to perform arithmetic processing such as various kinds of correction for the image signal (digital signal) output from the A/D converter 96, thereby generating image data. The image data is supplied to the memory unit 87, the external I/F unit 89, the general control/arithmetic unit 99, the recording medium control I/F unit 94, and the like. The memory unit 87 is connected to the image signal processing unit 97 to store the image data output from the image signal processing unit 97. The external I/F unit 89 is connected to the image signal processing unit 97. The image data output from the image signal processing unit 97 is transferred to an external device (for example, personal computer) via the external I/F unit 89. The timing generator 98 is connected to the image capturing device 86, the captured image signal processing circuit 95, the A/D converter 96, and the image signal processing unit 97 to supply timing signals to the image capturing device 86, the captured image signal processing circuit 95, the A/D converter 96, and the image signal processing unit 97. The image capturing device 86, the captured image signal processing circuit 95, the A/D converter 96, and the image signal processing unit 97 operate in synchronism with the timing signals. The general control/arithmetic unit 99 is connected to the timing generator 98, the image signal processing unit 97, and the recording medium control I/F unit 94 to the generally control the timing generator 98, the image signal processing unit 97, and the recording medium control I/F unit 94. The recording medium 88 is detachably connected to the recording medium control I/F unit 94. The image data output from the image signal processing unit 97 is recorded in the recording medium 88 via the recording medium control I/F unit 94.

The above-described arrangement enables to obtain a high-quality image (image data) if a high-quality image signal is obtained by the photoelectric conversion device 100.

Figure 3A:
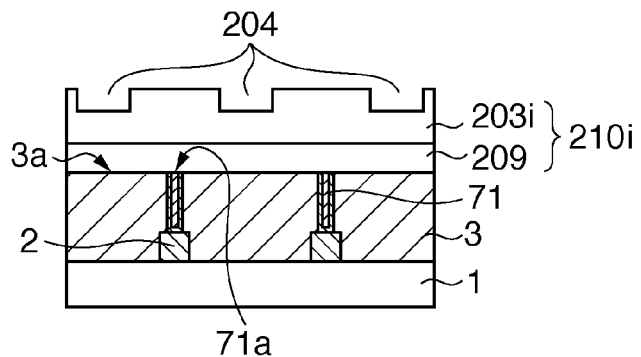
FIGS. 3A to 3D are sectional views showing steps in a method of manufacturing a photoelectric conversion device according to the second embodiment.
Figure 3B:
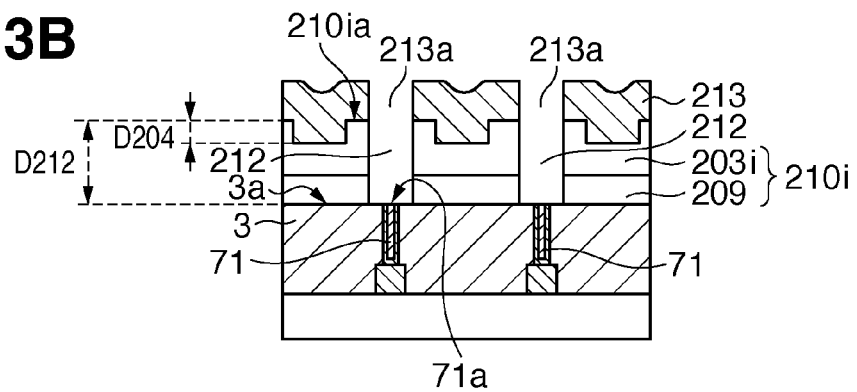
Figure 3C:
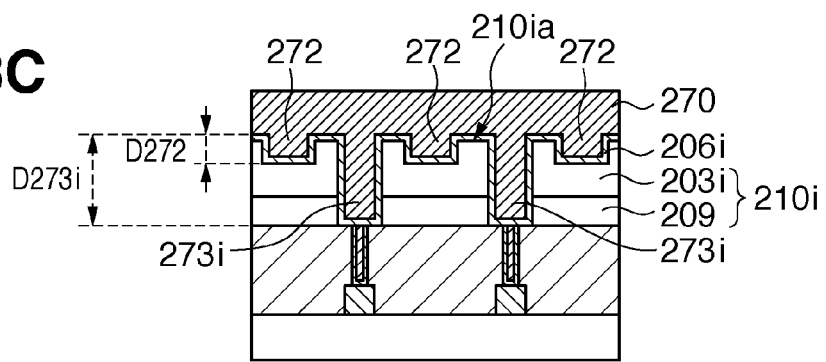
Figure 3D:
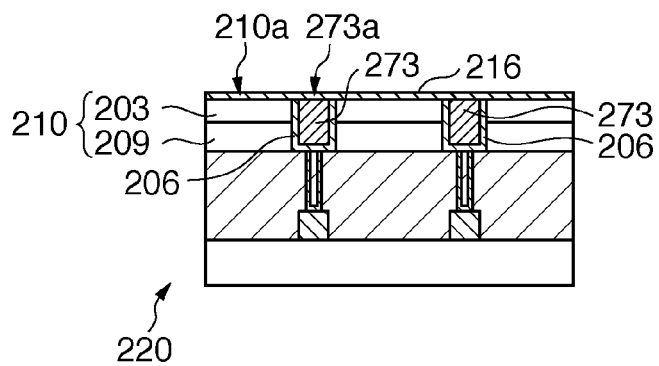

A method of manufacturing a semiconductor device 220 according to the second embodiment of the present invention will be described with reference to FIGS. 3A to 3D. Points different from the first embodiment will mainly be explained below. The method of manufacturing the semiconductor device 220 according to the second embodiment is different from the first embodiment in forming conductive lines with a single damascene structure. More specifically, the step shown in FIG. 3A is performed next to the step shown in FIG. 1C. In the step of FIG. 3A, a low-k film 209 is deposited (formed) on planarized upper surfaces 71a and 3a of electrically conductive portions 71 and an insulating layer 3. An insulating film 203i is deposited (formed) on the low-k film 209. That is, an interlayer insulating film (second insulating film) 210i including the low-k film 209 and the insulating film 203i is formed on the electrically conductive portions 71 and the insulating layer 3 (sixth step). Next, a third resist pattern is formed on the interlayer insulating film 210i. The third resist pattern has openings corresponding to regions where second planarization assisting portions 272 (to be described later) not to be used for electrical connections should be formed. Using the third resist pattern as a mask, etching is performed from a surface 210ia of the interlayer insulating film 210i up to a depth D204, thereby forming fourth holes 204 in the interlayer insulating film 210i (eighth step). The fourth holes 204 are used to arrange the planarization assisting portions 272 (to be described later) which are not used for electrical connections. The fourth holes 204 are formed to be shallower than third holes 212 (to be described later) (D204<D212). The fourth holes 204 are so deep not to reach, for example, the low-k film 209 but to allow to easily remove, by CMP (Chemical Mechanical Polishing), the second planarization assisting portions 272 embedded in the holes. After that, the third resist pattern is peeled off (removed). In the step of FIG. 3B, an insulating film is formed to cover the upper surface of the interlayer insulating film 210i and the side and bottom surfaces of the fourth holes 204. A fourth resist pattern is formed on the insulating film. The fourth resist pattern has openings corresponding to regions where first conductive lines 273 (to be described later) to be used for electrical connections should be formed. Using the fourth resist pattern as a mask, the insulating film is etched to form, from the insulating film, an insulating film pattern 213 having openings 213a in the regions where the first conductive lines 273 should be formed. Using the insulating film pattern 213 as a hard mask, etching (for example, dry etching) is performed from the surface 210ia of the interlayer insulating film 210i to the depth D212, thereby forming the third holes 212 in the interlayer insulating film 210i (seventh step). The third holes 212 are used to arrange first conductive lines 273i (to be described later) to be used for electrical connections. The third holes 212 are formed to be deeper than the fourth holes 204 (D212>D204). The third holes 212 are so deep as to reach, for example, the electrically conductive portions 71 or the interlayer insulating film 3. Instead of performing the seventh step next to the eighth step, the eighth step may be executed next to the seventh step. In the seventh and eighth steps, the plurality of third holes 212 and the plurality of fourth holes 204 can be formed in the interlayer insulating film 210i such that the plurality of holes including the plurality of third holes 212 and the plurality of fourth holes 204 are arranged at uniform pitches (equal densities). In the step of FIG. 3C, the insulating film pattern 213 is removed by dry etching. After that, a barrier metal 206i is deposited (formed) to cover the upper surface of the interlayer insulating film 210i, the side and bottom surfaces of the third holes 212, and the side and bottom surfaces of the fourth holes 204. The barrier metal 206i can have, for example, a Ta/TaN two-layer structure. Next, a second electrically conductive material 270 is deposited to further cover the upper surface 210ia of the interlayer insulating film 210i, the side and bottom surfaces of the third holes 212, and the side and bottom surfaces of the fourth holes 204. The second electrically conductive material 270 can be formed from a metal or an intermetallic compound containing at least one of, for example, Cu, W, Al, TiN, Ti, Ta, and TaN as a major component. To form the second electrically conductive material 270 of Cu, the second electrically conductive material 270 is deposited by, for example, electroplating. That is, the second electrically conductive material is embedded in the third holes 212 to form the first conductive lines (electrically conductive portions) 273i, and simultaneously, the second electrically conductive material 270 is embedded in the fourth holes 204 to form the second planarization assisting portions 272 (ninth step). This facilitates simultaneously forming the first conductive lines 273i and the second planarization assisting portions 272. Hence, the steps can be simplified as compared to a case in which the process of forming the first conductive lines 273i and the process of forming the second planarization assisting portions 272 are performed in different steps. In the step of FIG. 3D, the second electrically conductive material 270 undergoes CMP (Chemical Mechanical Polishing) using an abrasive (slurry) until the upper surface 210ia of the interlayer insulating film 210i is exposed. The first conductive lines 273, interlayer insulating film 210 (insulating film 203), and second planarization assisting portions 272 are further polished using the abrasive (slurry) until the second planarization assisting portions 272 are removed. Upper surfaces 273a and 210a of the first conductive lines 273 and the interlayer insulating film 210 (insulating film 203) are thus planarized (10th step). "Until the second planarization assisting portions 272 are removed" means that the CMP is performed up to a depth ranging from D272 to (D272+Dth) (both inclusive) from the upper surface 210ia of the interlayer insulating film 210i. Dth is a polishing thickness serving as a threshold not to degrade planarity when the upper surfaces of the first conductive lines 273 and the interlayer insulating film 210 are planarized without forming the second planarization assisting portions 272. In other words, Dth is a polishing thickness which makes the tilt angle of the polished surface with respect to the surface of a semiconductor substrate 1 fall within the tolerance when the upper surfaces of the first conductive lines 273 and the interlayer insulating film 210 are planarized without forming the second planarization assisting portions 272. When polishing is done until the second planarization assisting portions 272 are removed, the barrier metal 206i is removed except on the side and bottom surfaces of the first conductive lines 273i so that a barrier metal 206 that covers the side and bottom surfaces of the first conductive lines 273i remains. The first conductive lines 273 include, for example, signal lines to transmit a signal corresponding to the voltage from the charge-voltage converter. Alternatively, the first conductive lines 273 include, for example, power lines to supply power to predetermined transistors (for example, the amplification transistors of pixels). Next, a diffusion barrier film 216 is formed to cover the upper surfaces 273a of the first conductive lines 273 and the upper surface 210a of the second insulating layer 210. The diffusion barrier film 216 may cover only the upper surfaces 273a of the first conductive lines 273 and portions of the upper surface 210a of the second insulating layer 210 close to the upper surfaces 273a but not portions of the upper surface 210a far apart from the upper surfaces 273a. The diffusion barrier film 216 thus prevents diffusion of the material (for example, a metal) of the first conductive lines 273. The diffusion barrier film 216 can be made of, for example, SiN. In the 10th step, erosion (planarity degradation) in the planarization process of the single damascene process can be suppressed in this way. Especially, the plurality of holes including the plurality of third holes 212 and the plurality of fourth holes 204 may be arranged at uniform pitches (equal densities). Accordingly, the plurality of members including the plurality of first conductive lines 273$i$ and the plurality of second planarization assisting portions 272 are arranged at uniform pitches (equal densities). Since this structure can uniform the stress applied to the plurality of first conductive lines 273$i$ and the plurality of second planarization assisting portions 272 upon polishing in the planar direction along a surface 1a of the semiconductor substrate 1, variations in the polished amount in the planar direction can be reduced. It is consequently possible to effectively suppress erosion. "Uniform arrangement pitches" means that the arrangement can ensure allowable planarity after the planarization process. The first conductive lines 273, interlayer insulating film 210, and second planarization assisting portions 272 are polished until the second planarization assisting portions 272 are removed, thereby planarizing the upper surfaces 273a and 210a of the first conductive lines 273 and the interlayer insulating film 210. More specifically, since the fourth holes 204 are shallower than the third holes 212 (D204<D212), the depth of the second planarization assisting portions 272 from the upper surface 210$ia$ of the interlayer insulating film 210$i$ is smaller than the depth of the first conductive lines 273$i$ (D272<D273$i$). For these reasons, the first conductive lines 273 can easily obtain flat upper surfaces when the process of performing polishing until the second planarization assisting portions 272 are removed has ended. As a result, the process of improving the planarity of the upper surface of the interlayer insulating film 210 is simpler as a whole than in the case in which polishing is completed without removing the second planarization assisting portions 272, and the second planarization assisting portions 272 are removed later.

Figure 4A:
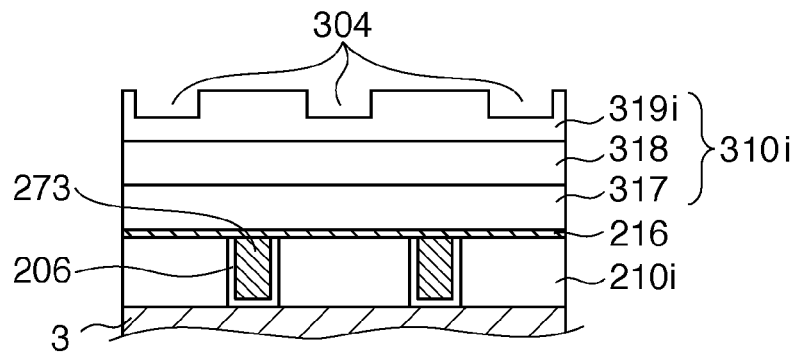
FIGS. 4A to 4F are sectional views showing steps in a method of manufacturing a photoelectric conversion device according to the third embodiment.
Figure 4B:
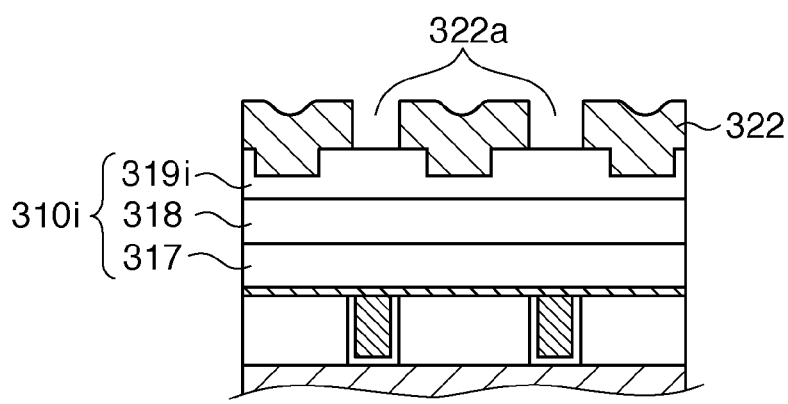
Figure 4C:
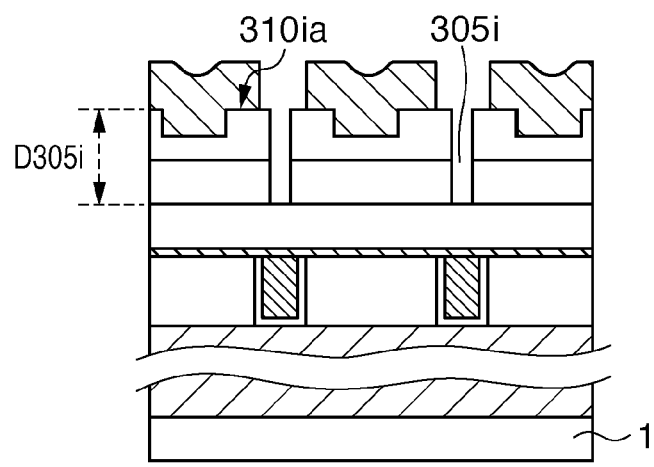
Figure 4D:
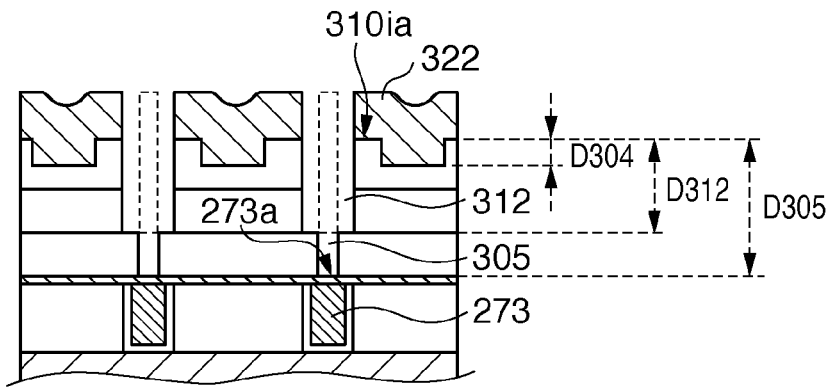
Figure 4E:
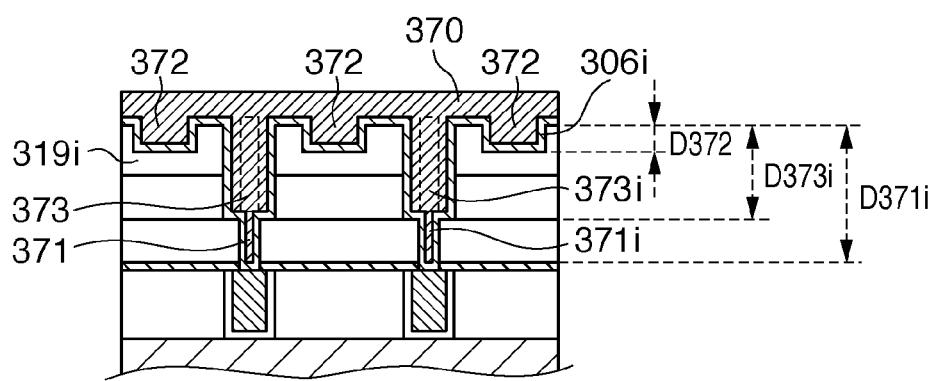
Figure 4F:
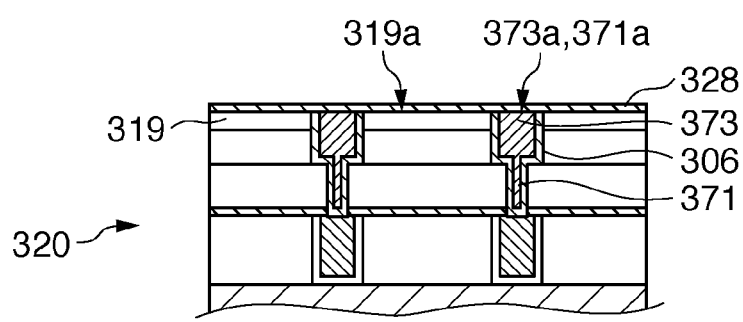

A method of manufacturing a semiconductor device 320 according to the third embodiment of the present invention will be described with reference to FIGS. 4A to 4F. Points different from the first and second embodiments will mainly be explained below. The method of manufacturing the semiconductor device 320 according to the third embodiment is different from the first embodiment in forming conductive lines with a dual damascene structure. More specifically, the step shown in FIG. 4A is performed next to the step shown in FIG. 3D. In the step of FIG. 4A, the same process as in the step of FIG. 3A is performed. In the step of FIG. 4B, an insulating film pattern 322 is obtained by the same method as that for the insulating film pattern 213 in the step of FIG. 3B. The insulating film pattern 322 has openings 322$a$ corresponding to regions where second conductive lines (electrically conductive portions) 373 should be formed. In the step of FIG. 4C, a fifth resist pattern (not shown) is formed on an interlayer insulating film 310$i$. The fifth resist pattern has openings corresponding to regions where electrically conductive portions 371 (FIG. 4F) should be formed. The interlayer insulating film 310$i$ includes an insulating film 317, low-k film 318, and insulating film 319$i$. Using the fifth resist pattern as a mask, etching is performed from a surface 310$ia$ of the interlayer insulating film 310$i$ up to a depth D305$i$, thereby forming second openings 305$i$ in the interlayer insulating film 310$i$. The second openings 305$i$ extend from part of regions on the upper surface of the interlayer insulating film 310$i$, which are exposed by the openings 322$a$, toward a semiconductor substrate 1. The depth D305$i$ of the second openings 305$i$ reaches, for example, the insulating film 317 but not a diffusion barrier film 216. In the step of FIG. 4D, the fifth resist pattern is removed. Then, using the insulating film pattern 322 as a hard mask, etching is performed until the openings 322$a$ extending from the surface of the interlayer insulating film 310$i$ reach a depth D312, and the second openings 305$i$ reach a depth D305. With this process, first holes 305 are formed in the interlayer insulating film 310$i$, and fifth holes 312 are formed so as to overlap the first holes 305 in the interlayer insulating film 310$i$. The fifth holes 312 are shallower than the first holes 305 and deeper than second holes 304 (D304<D312<D305). The first holes 305 and the fifth holes 312 share portions indicated by broken lines at the positions where they overlap. In the step of FIG. 4E, after the insulating film pattern 322 is removed, a electrically conductive material 370 is embedded in the fifth holes 312 to form the second conductive lines (electrically conductive portions) 373$i$. Except the above-described point, the same process as in the step of FIG. 1B is performed. Since the fifth holes 312 are shallower than the first holes 305 and deeper than second holes 304 (D304<D312<D305), second conductive lines 373$i$ are shallower than electrically conductive portions 371$i$ and deeper than second planarization assisting portions 372 (D372 <D373$i$<D371$i$). In the step of FIG. 4F, upper surfaces 373$a$ of the second conductive lines 373 are planarized. Except the above-described point, the same process as in the step of FIG. 3D is performed.

Note that in the above-described first to third embodiments, if the semiconductor device includes a photoelectric conversion device having a pixel array region and a peripheral region, the planarization assisting portions (or the second planarization assisting portions) may be formed in the pixel array region but not in the peripheral region. Such an embodiment is possible because in a general photoelectric conversion device, the conductive lines and vias are arranged at a higher density in the peripheral region than in the pixel array region. More specifically, the second holes (or fourth holes) are formed in the pixel array region but not in the peripheral region. Accordingly, the planarization assisting portions (or second planarization assisting portions) are formed in the pixel array region but not in the peripheral region. The planarization assisting portions (or second planarization assisting portions) may be laid out in the pixel array region as shown in, for example, FIG. 5A. FIG. 5A is a plan view (viewed from a direction perpendicular to the surface 1a of the semiconductor substrate 1) showing the layout of a portion corresponding to one pixel in the pixel array region of a photoelectric conversion device. As shown in FIG. 5A, two conductive lines 29 define an opening region for a photoelectric converter 31. The photoelectric converter 31 is arranged in an active region 32 defined by an element isolation portion 35. The photoelectric converter 31 can be, for example, a photodiode. The photoelectric converter 31 generates and accumulates charges corresponding to light. A transfer transistor is turned on when its gate electrode 33 has received a transfer control signal of active level, thereby transferring the charges generated in the photoelectric converter 31 to a charge-voltage converter 36. The charge-voltage converter 36 converts the transferred charges into a voltage. The charge-voltage converter 36 is, for example, a floating diffusion. The voltage from the charge-voltage converter 36 is input to a gate electrode 37 of an amplification transistor via a contact plug 34 and a conductive line (not shown). The amplification transistor outputs, to signal lines (for example, conductive lines 29), a signal corresponding to the voltage from the charge-voltage converter 36. A planarization assisting portion 30a is arranged above the photoelectric converter 31. A planarization assisting portion 30b is arranged off to the upper side of the photoelectric converter 31. In this case as well, the planarization assisting portions 30a and 30b are finally removed so that the state shown in FIG. 5B is obtained. Therefore, it is possible to reduce the adverse effects of the planarization assisting portions 30a and 30b on the electrical and optical characteristics of the photoelectric conversion device. In addition, the layout can be changed such that the planarization assisting portions 30a and 30b are arranged at longer distances from the photoelectric converter 31 without overlapping the photoelectric converter 31 when viewed from the direction perpendicular to the surface 1a of the semiconductor substrate 1. In this case, etching damage to the photoelectric converter can be reduced when forming the second holes (or fourth holes) to form the planarization assisting portions (or second planarization assisting portions). In this embodiment, no planarization assisting portions are provided in the peripheral region. However, the planarization assisting portions may be provided in the peripheral region, as a matter of course.

In the above-described embodiments, the semiconductor device 20 includes the photoelectric conversion device 100. However, the semiconductor device 20 may include a memory device such as a DRAM (Dynamic Random Access Memory) or a processor such as a CPU (Central Processing Unit) or DSP (Digital Signal Processor), for example, in place of or in addition to the photoelectric conversion device 100.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing a photoelectric conversion device, the method comprising:
    preparing a structure including a semiconductor substrate having a photoelectric converter, and an insulating film arranged on the semiconductor substrate, the insulating film including a first hole having a first depth and a second hole having a second depth smaller than the first depth, wherein the second hole is arranged within a region of the photoelectric converter when viewed form a direction perpendicular to a surface of the semiconductor substrate;
    filling the first hole and the second hole with a material that is different from that of the insulating film; and
    removing part of the insulating film by chemical mechanical polishing such that the second hole disappears.

2. The method according to claim 1, wherein the removing of the second hole includes performing chemical mechanical polishing up to a depth deeper than the second depth.

3. The method according to claim 1, wherein at least one of a via plug and a conductive line is formed in the first hole.

4. The method according to claim 1, wherein a plurality of holes including a plurality of first holes and a plurality of second holes are arranged at uniform pitches.

5. The method according to claim 1, wherein the structure further includes two conductive lines which define an opening region for the photoelectric converter, and the second hole is arranged at a position between the two conductive lines.

6. The method according to claim 1, wherein the preparing of the structure includes forming the first hole and the second hole by etching.

7. The method according to claim 1, wherein the material includes a structure selected from the group consisting of:
    (i) a TiN single-layer structure; and
    (ii) a structure including (a) a barrier metal of a Ti/TiN two-layer structure, and (b) a metal or intermetallic compound, the metal or intermetallic compound containing at least one of Cu, W, Al, TiN, Ti, Ta, and TaN as a major component.

8. The method according to claim 1, wherein the first hole is a hole for a plug.

9. The method according to claim 1, wherein one second hole is provided to one photoelectric converter.

10. The method according to claim 1, wherein the second hole is arranged such that a centroid of the second hole accords with that of the photoelectric converter.

11. The method according to claim 1, wherein one second hole is provided to one photoelectric converter and the second hole is arranged such that a centroid of the second hole accords with that of the photoelectric converter.

12. The method according to claim 1, wherein the first hole is a hole for a plug, and one second hole is provided to one photoelectric converter and the second hole is arranged such that a centroid of the second hole accords with that of the photoelectric converter.

* * * * *